(12) United States Patent
Goelzhaeuser et al.

(10) Patent No.: US 10,229,786 B2
(45) Date of Patent: Mar. 12, 2019

(54) MULTILAYER STRUCTURE

(71) Applicant: CNM Technologies GmbH, Bielefeld (DE)

(72) Inventors: Armin Goelzhaeuser, Bielefeld (DE); Andre' Beyer, Bielefeld (DE); Paul Penner, Bielefeld (DE); Xianghui Zhang, Bielefeld (DE)

(73) Assignee: CNM TECHNOLOGIES GMBH, Bielefeld (DE)

( * ) Notice: Subject to any disclaimer, the term of this patent is extended or adjusted under 35 U.S.C. 154(b) by 0 days.

(21) Appl. No.: 15/322,131

(22) PCT Filed: Jun. 26, 2015

(86) PCT No.: PCT/EP2015/064562
§ 371 (c)(1),
(2) Date: Dec. 26, 2016

(87) PCT Pub. No.: WO2015/197834
PCT Pub. Date: Dec. 30, 2015

(65) Prior Publication Data
US 2017/0140873 A1    May 18, 2017

(30) Foreign Application Priority Data
Jun. 26, 2014    (GB) .................................. 1411334.4

(51) Int. Cl.
*H01G 4/30*    (2006.01)
*H01G 4/33*    (2006.01)
(Continued)

(52) U.S. Cl.
CPC .............. *H01G 4/30* (2013.01); *H01G 4/008* (2013.01); *H01G 4/14* (2013.01); *H01G 4/206* (2013.01);
(Continued)

(58) Field of Classification Search
None
See application file for complete search history.

(56) References Cited

U.S. PATENT DOCUMENTS

| 2005/0207094 A1* | 9/2005 | Borland | C04B 35/468 |
| | | | 361/321.5 |
| 2009/0174435 A1 | 7/2009 | Stan et al. | |
| 2013/0050901 A1* | 2/2013 | Lee | H01G 4/12 |
| | | | 361/321.4 |

FOREIGN PATENT DOCUMENTS

| CN | 103337362 A | 10/2013 |
| EP | 1222498 B1 | 9/2000 |

(Continued)

OTHER PUBLICATIONS

A. J. Kronemeijer et al., "Electrical characteristics of conjugated self-assembled monolayers in large-area molecular junctions." Applied Physics Letters 97, 173302 (2010).
(Continued)

*Primary Examiner* — Dion Ferguson
(74) *Attorney, Agent, or Firm* — 24IP Law Group; Timothy R DeWitt

(57) ABSTRACT

A multilayer structure comprising a first layer, a second layer and a third layer, a capacitor comprising at least one multilayer structure, a capacitor comprising at least two two-layer structures, a method of manufacture of the multilayer structure, a method of manufacture of the capacitor, a microelectronic device and an energy storage device comprising the capacitor. The multilayer structure comprises a first layer, a second layer and a third layer, wherein the first layer and the third layer each form at least one of at least two electrodes and comprise one or more pyrolyzed carbon nanomembranes or one or more layers of graphene, and the second layer is a dielectric comprising one or more carbon nanomembranes.

10 Claims, 5 Drawing Sheets

(51) Int. Cl.
| | |
|---|---|
| H01G 4/008 | (2006.01) |
| H01G 4/14 | (2006.01) |
| H01G 4/20 | (2006.01) |
| H01G 4/32 | (2006.01) |
| H01G 11/36 | (2013.01) |
| H01L 49/02 | (2006.01) |

(52) U.S. Cl.
CPC ............. *H01G 4/32* (2013.01); *H01G 4/33* (2013.01); *H01G 11/36* (2013.01); *H01L 28/60* (2013.01)

(56) References Cited

FOREIGN PATENT DOCUMENTS

| EP | 1 712 298 B1 | 6/2006 |
|---|---|---|
| WO | 2009030473 | 3/2009 |

OTHER PUBLICATIONS

A. Mishchenko et al., "Influence of Conformation on Conductance of Biphenyl-Dithiol Single-Molecule Contacts." Nano Letters 10, 156 (2010).

A. Turchanin, et al., "One Nanometer Thin Carbon Nanosheets with Tunable Conductivity and Stiffness." Advanced Materials 21, 1233 (2009).

Amin et al., "Polymer Carpets." Small 6, 1623 (2010).

C. T. Nottbohm et al., "Novel carbon nanosheets as support for ultrahigh-resolution structural analysis of nanoparticles." Ultramicroscopy 108, 885 (2008).

D. A. Egger et al., "Polarity Switching of Charge Transport and Thermoelectricity in Self-Assembled Monolayer Devices." Advanced Materials 24, 4403 (2012).

H. B. Akkerman, B. de Boer, "Electrical conduction through single molecules and self-assembled monolayers." Journal of Physics: Condensed Matter 20, 013001 (2008).

Eck et al., "Freestanding nanosheets from crosslinked biphenyl self-assembled monolayers." Advanced Materials 17, 2583 (2005).

Holmlin et al., "Electron Transport through Thin Organic Films in Metal-Insulator-Metal Junctions Based on Self-Assembled Monolayers." J. Am. Chem. Soc., 123, 5075 (2001).

H. B. Akkerman et al., "Towards molecular electronics with large-area molecular junctions." Nature 441, 69 (2006).

Felgenhauer et al., "Electrochemical and exchange studies of self-assembled monolayers of biphenyl based thiols on gold." J. Electroanal. Chem. 550-551, 309 (2003).

G. Wang et al., "A New Approach for Molecular Electronic Junctions with a Multilayer Graphene Electrode." Advanced Materials 23, 755 (2011).

G. Heimel et al., "Modeling the Electronic Properties of Pi-Conjugated Self-Assembled Monolayers." Advanced Materials 22, 2494 (2010).

T. Ishida et al., "Electrical Conduction of Conjugated Molecular SAMs Studied by Conductive Atomic Force Microscopy." J. Phys. Chem. A, 106, 3271 (2002).

J. G. Kushmerick et al., "Metal-Molecule Contacts and Charge Transport across Monomolecular Layers: Measurement end Theory." Physical Review Letters 89, 086802 (2002).

L. A. Bumm et al., "Electron Transfer through Organic Molecules." J. Phys. Chem. B 103, 8122 (1999).

L. Venkataraman et al., "Dependence of single-molecule junction conductance on molecular conformation." Nature 442, 904 (2006).

M. Leijnse, "Interaction effects in electric transport through self-assembled molecular monolayers." Physical Review B 87, 125417 (2013).

Shi et al., "Boron Nitride-Graphene Nanocapacitor and the Origins of Anomalous Size-Dependent Increase of Capacitance." Nano Letters 14, 1739 (2014).

R. C. Chiechi et al., "Eutectic Gallium-Indium (EGaIn): A Moldable Liquid Metal for Electrical Characterization of Self-Assembled Monolayers." Angew. Chem. Int. Ed. 47, 142 (2008).

S. H. Choi et al., "Electrical resistance of long conjugated molecular wires." Science 320, 1482 (2008).

A. Turchanin, A. Gölzhäuser, "Carbon nanomembranes from self-assembled monolayers: Functional surfaces without bulk." Progress in Surface Sciences 87, 108 (2012).

V. B. Engelkes et al., "Length-Dependent Transport in Molecular Junctions Based on SAMs of Alkanethiols and Alkanedithiols: Effect of Metal Work Function and Applied Bias on Tunneling Efficiency and Contact Resistance." J. Am. Chem. Soc. 126, 14287 (2004).

S. Wakamatsu et al., "Dependence of Tunneling Current Through a Single Molecule of Phenylene Oligomers on the Molecular Length." Ultramicroscopy 97, 19 (2003).

W. Y. Wang et al., "Mechanism of electron conduction in self-assembled alkanethiol monolayer devices." Phys. Rev. B 68, 035416 (2003).

D. J. Wold et al., "Distance Dependence of Electron Tunneling through Self-Assembled Monolayers Measured by Conducting Probe Atomic Force Microscopy: Unsaturated versus Saturated Molecular Junctions." J Phys Chem B 106, 2813 (2002).

Woszczyna et al., "All-Carbon Vertical van der Waals Heterostructures: Non-destructive Functionalization of Graphene for Electronic Applications." Adv. Mat., 26, 4831 (2014).

X. Zhang et al., "Mechanical characterization of carbon nanomembranes from self-assembled monolayers." Beilstein J Nanotech. 2, 826 (2011).

Y. Selzer et al., "The Importance of Chemical Bonding to the Contact for Tunneling through Alkyl Chains." J. Phys. Chem. B 106, 10432 (2002).

Lee, J. A., Shin, M. K., Kim, S. H., Kim, S. J., Spinks, G. M., Wallace, G. G., . . . Baughman, R. H. (2012). Hybrid nanomembranes for high power and high energy density supercapacitors and their yarn application. ACS Nano, 6(1), 327-334.

\* cited by examiner

MULTILAYER STRUCTURE

CROSS-REFERENCE TO RELATED APPLICATIONS

This application claims benefit to and priority of UK Patent Application No. 1411334.4 filed on 26 Jun. 2014 and entitled "Multilayer Structures".

FIELD OF THE INVENTION

The field of the invention relates to a multilayer structure comprising a first layer, a second layer and a third layer, a capacitor comprising at least one multilayer structure, a capacitor comprising at least two two-layer structures, a method of manufacture of the multilayer structure, a method of manufacture of the capacitor, a microelectronic device and an energy storage device comprising the capacitor.

BACKGROUND OF THE INVENTION

Large-area molecular electronics incorporating highly ordered self-assembled monolayers (SAMs) provide a promising route to the fabrication of reliable and stable nanodevices, as well as a versatile platform to tailor the electronic transport properties at the molecular level (H. B. Akkerman, B. de Boer, J. Phys. Condens. Mat. 2008, 20, 013001; H. B. Akkerman et al., Nature 2006, 441, 69). For small-area molecular junctions, charge transport through SAMs has been intensively studied using a variety of methods, such as scanning tunneling microscopy (STM) (L. A. Bumm et al., J. Phys. Chem. B 1999, 103, 8122), conducting-probe atomic force microscopy (CP-AFM) (V. B. Engelkes et al., J. Am. Chem. Soc. 2004, 126, 14287), nanopore device (W. Y. Wang et al., Phys. Rev. B 2003, 68, 035416), and cross-wire junction (J. G. Kushmerick et al., Phys. Rev. Lett. 2002, 89, 086802). Different methods for large-area junctions were also applied, for instance, using a conductive polymer or graphene multilayers as an interlayer (A. J. Kronemeijer et al., Appl. Phys. Lett. 2010, 97, 173302; G. Wang et al., Adv. Mater. 2011, 23, 755), Hg-droplet-based electrode (Y. Selzer et al., J. Phys. Chem. B 2002, 106, 10432), and eutectic Ga—In (EGaIn) tip-based electrode (R. C. Chiechi et al., Angew. Chem. Int. Ed. 2008, 47, 142). The mechanism of charge transport through alkanethiol SAMs is off-resonant tunneling with a tunneling decay factor $\beta$ from 0.51 to 1.16 $\text{Å}^{-1}$ (H. B. Akkerman, B. de Boer, J. Phys. Condens. Mat. 2008, 20, 013001). For $\pi$-conjugated molecules shorter than ~3 nm the transport is still dominated by a tunneling mechanism, while hopping conduction has been observed for the $\pi$-conjugated molecules longer than ~3 nm (S. H. Choi et al., Science 2008, 320, 1482). Understanding of relationships between the molecular structure and the charge transport characteristics is still a big challenge. The influence of molecular conformation on the conductance has been investigated on single molecule junctions. For instance, the biphenyl derivatives with smaller torsion angles between two phenyl rings possess higher conductance than those biphenyl derivatives with larger torsion angles (A. Mishchenko et al., Nano Lett. 2010, 10, 156; L. Venkataraman et al., Nature 2006, 442, 904). Moreover, differences between single-molecule and monolayer junctions have been investigated in terms of local molecular environment of a monolayer junction, such as interfacial charge rearrangement, dipole-dipole interactions, and intermolecular Coulomb interactions (D. A. Egger et al., Adv. Mater. 2012, 24, 4403; G. Heimel et al., Adv. Mater. 2010, 22, 2494; M. Leijnse, Phys. Rev. B 2013, 87, 125417).

Electron irradiation causes decomposition of aliphatic SAMs, but induces lateral cross-linking (coupling of the adjacent phenyl rings) in aromatic SAMs. The cross-linking of SAMs gives rise to a carbon nanomembrane (CNM) (A. Turchanin, A. Golzhäuser, Prog. Surf. Sci. 2012, 87, 108) of molecular thickness that exhibits enhanced mechanical strength and thermal stability (X. Zhang et al., Beilstein J Nanotech. 2011, 2, 826). The terms "carbon nanomembrane" and "cross-linked SAMs" can therefore be used synonymously. Carbon nanomembranes have also been described in EP 1 222 498 B1. The carbon nanomembranes in this patent arise from low molecular aromatics which are cross-linked in the lateral direction.

Due to its remarkable mechanical properties, the CNMs can be released from the initial substrate and transferred onto another solid or porous support and thereby form suspended membranes with macroscopic lateral size (C. T. Nottbohm et al., Ultramicroscopy 2008, 108, 885; A. Turchanin et al., Adv. Mater. 2009, 21, 1233). Eck et al. have shown that the CNMs are stable as freestanding membranes and can be transferred. The CNMs have been released from a substrate by selective cleavage of the anchorgroup-substrate bond or by dissolution of the substrate (Eck et al., Adv. Mater. 2005, 17, 2583).

While a molecular junction of SAMs is considered to be an ensemble of many parallel molecular junctions, the cross-linked SAMs or CNMs provide a unique two-dimensional (2D) system of covalently bonded molecular junctions.

Carbon nanomembranes can be used in layer systems for use as a microelectronic device or a capacitor, in which the carbon nanomembrane is used as the insulating layer. Such a layer system comprising carbon nanomembranes has been described in EP 1 712 298 B1. The organic molecules which are cross-linked in the lateral direction are chemisorbed on the substrate. The compounds forming the cross-linked monolayer comprise an anchor group for chemisorption on the substrate. An electrically conductive, ferromagnetic or semiconductor layer is deposited on top of the monolayer. The layer system of EP 1 712 298 B1 comprises a thin isolating layer. It is not intended, however, to provide particularly thin electrodes. In EP 1 712 298 B1, the top working layer is prepared by adsorbing metal atoms or organic molecules on top of the cross-linked monolayer.

Layer systems of the state of the art usually comprise conventional electrodes which are not very light weight. They are also not very flexible and stable. A further disadvantage of conventional microelectronic devices or capacitors comprising layer systems is that they often comprise harmful or toxic components.

Another layer system is disclosed in Shi et al. (Nano Lett. 2014, 14, 1739). The disclosed nanocapacitor comprises a thin hexagonal boron nitride layer as a dielectric. The preparation of boron nitride is complex and it is difficult to prepare thin homogenous monolayers of boron nitride on large areas. Functionalization of boron nitride is not possible.

An article by Woszczyna et al "All-carbon vertical van der Waals heterostructures: Non-destructive functionalization of graphene for electronic applications" in Advanced Materials, vol 26 (2014), 28, 4831-4837, teaches the manfuacture of a heterostructure comprising an amino-terminatied carbon nanomembrane and a single layer graphene sheet grown on an oxidised silicon wafer. The heterostructures can be used for the fabrication of field-effect devices.

It is an object of the present invention to provide a carbon-based, light-weight multilayer structure comprising ultrathin, flexible and stable layers for use as a capacitor with a high energy density and without harmful or toxic components. It is also an object of the present invention to provide a capacitor comprising at least one multilayer structure, a method of manufacture of a multilayer structure and a microelectronic and an energy storage device comprising the capacitor.

SUMMARY OF THE INVENTION

A multilayer structure comprising a first layer, a second layer and a third layer is disclosed. The first layer and the third layer each form at least one of at least two electrodes and comprise one or more pyrolysed carbon nanomembranes or one or more layers of graphene, and the second layer is a dielectric comprising one or more carbon nanomembranes. The multilayer structure is manufactured substantially from carbon and includes no potentially toxic components and have thus a low environmental impact. The multilayer structure can be used, for example, to manufacture implantable electronic devices which are compatible with living organisms, as the multilayer structure is made substantially from carbon, which is expected to be compatible to living tissue.

In one aspect of the disclosure, at least one of the first layer or the third layer has a thickness of 0.3 to 20 nm. At least one of the first layer or the third layer may thus have a minimal thickness of 0.3 nm.

In a further aspect of the disclosure, at least one of the one or more carbon nanomembranes of the second layer has a thickness of 1 to 2 nm and the total thickness of the second layer is 1 to 50 nm. At least one or more carbon nanomembranes of the second layer may thus have a minimal thickness of 1 nm.

The total thickness of the multilayer structure may be 1.6 to 90 nm.

It is further intended that the carbon nanomembranes may comprise aromatic molecules, which are cross-linked in the lateral direction.

The multilayer structure may have a resistance of at least 10 kOhm·cm$^2$.

The multilayer structure may have a maximum capacitance of 5 µF cm$^{-2}$.

In a further aspect of the disclosure, at least one of the surfaces of the carbon nanomembrane or the surfaces of the pyrolysed carbon nanomembrane are functionalized.

A capacitor comprising at least one multilayer structure is also disclosed.

A capacitor comprising at least two two-layer structures, wherein each of the at least two two-layer structures comprises a first layer and a second layer as disclosed above and wherein the at least two two-layer structures are wound onto a former or layered on top of each other is also disclosed.

The multilayer structure comprising a first layer, a second layer and a third layer, may be manufactured by a method comprising the steps of:
separately preparing the first layer and the third layer, wherein the first layer and the third layer each comprise at least one pyrolysed carbon nanomembrane by the steps of:
a) providing at least one substrate layer,
b) adding carbon-containing compounds to a surface of the at least one substrate layer
c) cross-linking of the carbon-containing compounds, thus forming at least one carbon nanomembrane on the surface of the at least one substrate layer,
d) removing the at least one carbon nanomembrane from the at least one substrate layer,
e) wherein either after method step c) or after method step d) the method further comprises pyrolysing the carbon nanombrane to form a pyrolysed carbon nanomembrane, thus separately forming the first layer and the third layer,
preparing the second layer comprising at least one carbon nanomembrane by the steps of:
i) providing a substrate layer,
ii) adding carbon-containing compounds to a surface of the substrate layer
iii) cross-linking of the carbon-containing compounds, thus forming the at least one carbon nanomembrane on the surface of the substrate layer,
iv) removing the at least one carbon nanomembrane from the substrate layer,
forming the multilayer structure by applying the second layer onto a surface of the first layer, and applying the third layer onto a surface of the second layer.

In one aspect of the disclosure, at least one of the first layer or the third layer may comprise a plurality of pyrolysed carbon nanomembranes formed by steps a) to e) and layering the plurality of pyrolysed carbon nanomembranes on top of each other, thus separately forming the at least one of the first layer and the third layer.

In a further aspect of the disclosure, at least one of the first layer or the third layer comprise a plurality of carbon nanomembranes formed by the above steps a) to d), layering the plurality of carbon nanomembranes on top of each other, and subsequently pyrolysing according to step e) the plurality of carbon nanomembranes to form a pyrolised carbon nanomembrane, thus separately forming the at least one of the first layer and the third layer.

The second layer may comprise a plurality of carbon nanomembranes formed by the above steps i) to iv), and subsequently layering the plurality of carbon nanomembranes on top of each other.

In a further aspect of the disclosure, the second layer comprises a plurality of carbon nanomembranes formed by the above steps i) to iv), wherein after the above step iii), the steps ii) and iii) are repeated to thereby obtain the plurality of carbon nanomembranes on the surface of the substrate layer, which are layered onto one another, and in the above step iv), the more than one carbon nanomembrane is removed from the substrate.

In one aspect of the disclosure, the forming of the multilayer structure comprises layering the first layer, the second layer and the third layer onto one another.

The method of manufacture may further comprise functionalising at least one of a plurality of surfaces of the carbon nanomembrane or the surfaces of the pyrolysed carbon nanomembrane.

The functionalising may be performed by chemical lithography.

The capacitor as disclosed above may be manufactured by a method, comprising the step of winding onto a former or layering on top of each other the at least two two-layer structures, wherein each of the at least two two-layer structures comprises a first layer and a second layer as disclosed above.

A microelectronic device comprising the above capacitor is also disclosed.

An energy storage device comprising the above capacitor is also disclosed.

DETAILED DESCRIPTION OF THE INVENTION AND THE FIGURES

The invention will now be described in detail. Drawings and examples are provided for better illustration of the invention. It will be understood that the embodiments and aspects of the invention described herein are only examples and do not limit the protector's scope of the claims in any way. The invention is defined by the claims and their equivalents. It will be understood that features of one aspect or embodiment of the invention can be combined with the feature of a different aspect or aspects and/or embodiments of the invention.

Figure 1:
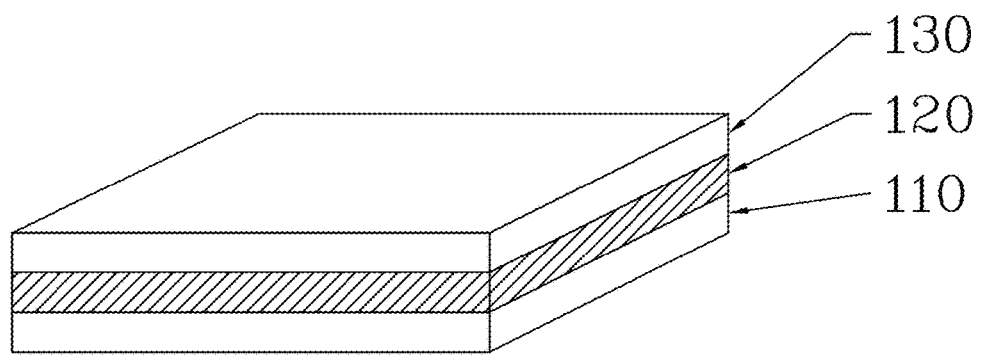
FIG. 1: Multilayer structure

FIG. 1 shows a multilayer structure according to the present invention comprising a first layer 110, a second layer 120 and a third layer 130, wherein the first layer and the third layer each form at least one of at least two electrodes and comprise one or more pyrolysed carbon nanomembranes or one or more layers of graphene, and the second layer is a dielectric comprising one or more carbon nanomembranes.

The terms "carbon nanomembranes" (CNM) and "cross-linked self-assembled monolayers" (cross-linked SAM) are used synonymously in the present disclosure. The multilayer structure of the present disclosure comprises a first layer, a second layer and a third layer. The first and the third layer each form at least one of at least two electrodes and comprise one or more pyrolysed carbon nanomembranes or one or more layers of graphene. The second layer is a dielectric comprising one or more carbon nanomembranes and thus forms the insulating layer. Each layer is ultrathin and mechanically stable. The multilayer structure therefore comprises conductive and non-conductive/insulating nanomembranes. A capacitor comprising the at least one multilayer structure is much thinner than conventional capacitors.

The at least one multilayer structure which can be used as a capacitor is almost completely based on carbon (besides hydrogen and, optionally, nitrogen, sulphur or oxygen adatoms). The carbon-based construction of the carbon nanomembranes are very light weight. The carbon nanomembrane is also very flexible and can be used for application in flexible polymer electronics. The multilayer structure is comprised of carbon nanomembranes or graphene. No other components are necessary.

The carbon nanomembranes can be easily transferred and can therefore be termed "freestanding" carbon nanomembranes. The carbon nanomembranes show high mechanical strength and thermal stability. Carbon nanomembranes can be prepared as thin homogenous monolayers on a large scale, i. e. on large areas (for example larger than several square meters).

The carbon nanomembranes have a low environmental impact. The carbon nanomembranes do not include environmentally harmful or toxic components, that can be found in other capacitors, such as carbon-based supercapacitors, which use such environmentally harmful components as electrolytes.

The process of pyrolysis refers to the heating of the compounds under inert gas or a reduced pressure. The pyrolysis of amorphous organic carbon nanomembranes leads to a structural change of the aromatic rings incorporated in the organic carbon nanomembranes, which renders the carbon nanomembranes conductive. The term "pyrolysed carbon nanomembranes" is therefore synonymous with the term "conductive carbon nanomembranes". With further pyrolysis, nanocrystalline graphene is formed, as described in international patent application No. WO 2009/030473. However, the graphene of the present disclosure can also be provided by any other method.

The pyrolysed carbon nanomembranes or graphene used as an electrode instead of conventional electrodes lead to a reduction in the weight, and increased flexibility and stability. Short circuits can be avoided although the carbon nanomembranes are extremely thin, because the electrode layers are two-dimensional structures, which are transferred as a whole and thus cover pinholes and small defects in the dielectric layer like a blanket. In contrast, conventional thin electrodes are usually produced by deposition techniques such as atomic layer deposition, so that pinholes and small defects in the dielectric layer are filled with electrode material leading to a short circuit between the electrode layers. The multilayer structure is almost completely based on carbon and does not include any harmful or toxic components.

It was surprising that 1.) a multilayer structure as herein described can be formed and used as a capacitor, 2.) such a multilayer structure may have a resistance of at least 10 kOhm·cm$^2$, which was not obvious for a multilayer structure with a dielectric layer consisting of a material with a conjugated electron system, 3.) the dielectric layer as well as the electrode layers in the multilayer structure can be both produced substantially from carbon alone, 4.) the layers in the multilayer structure as herein described can be individually produced and subsequently transferred onto each other to form the multilayer structure, and 5.) short circuits over pinholes and small defects in the dielectric layer can be avoided due to the two-dimensional structure of the electrode layer material.

The resistance of the multilayer structure can be considered to be a junction resistance. The following resistance values of the dielectric layer (which would be used as second layer 120) were measured using a two terminal setup composed of an EGaIn tip as a top-probe electrode and an Au substrate as a second electrode, whereby the contact area of the EGaIn tip was estimated by analyzing the image taken of it by a camera:

TABLE 1

Resistance of the multilayer structure depending on the dielectric.

| Dielectric | Resistance |
| --- | --- |
| Biphenyl-CNM | 17.5 kOhm · cm$^2$ |
| Nitrobiphenyl-CNM | 50 kOhm · cm$^2$ |
| Terphenyl-CNM | 110 kOhm · cm$^2$ |
| p-Quaterphenylthiol-CNM | 370 kOhm · cm$^2$ |
| Double layer Biphenyl-CNM | 3.5 MOhm · cm$^2$ |
| Double layer Nitrobiphenyl-CNM | 1.5 MOhm · cm$^2$ |
| Triple layer Biphenyl-CNM | >63 MOhm · cm$^2$ |

CNM = carbon nanomembrane

It has thus become evident from these data that longer phenyl chains as well as additional layers of the carbon nanomembranes lead to higher resistances.

Electrical measurements of any kind, for example conducting-probe atomic force microscopy, scanning tunneling microscopy, using large area electrodes etc., can be used to determine the resistance.

The relative dielectric constant of a CNM depends on the material. The relative dielectric constant of a biphenyl-CNM is between 1 and 10.

The choice of the carbon nanomembranes thus influences the properties of the dielectric layer, such as the relative dielectric constant and the mechanical properties (Zhang et al., Beilstein J. Nanotechnol. 2011, 2, 826). It is therefore possible to adjust the mechanical stability, the electric conductivity and the permittivity of the multilayer structure over a wide range.

The teachings of this disclosure allow the manufacture of capacitors, which comprise ultrathin and ultralight carbon layers. Such capacitors are termed "foil capacitors" because of their layer structure. The energy density of the capacitors comprising the multilayer structure of the present disclosure is extremely high.

The aromatic molecules comprised in the carbon nanomembrane can be any aromatic molecules. Non-limiting examples of such aromatic molecules are phenyl, biphenyl, terphenyl, quaterphenyl, naphthaline, anthracene, bipyridine, terpyridine, thiophene, bithienyl, terthienyl, pyrrole and combinations thereof. The aromatic molecules are then cross-linked in the lateral direction.

The multilayer structure has a maximum capacitance of 5 $\mu F\ cm^{-2}$. The thicker the dielectric, the smaller the capacitance. The capacitance can be even smaller when more than one multilayer structure is layered on top of one another. The value of the maximum capacitance is based on a multilayer structure wherein the dielectric has a thickness of 1 nm and the dielectric constant is $\varepsilon_r=5.5$ (Felgenhauer et al., J. Electroanal. Chem. 550-551, 309 (2003)).

A layered capacitor with a size of 1 cm*1 cm*0.01 cm (volume=$10^{-8}$ $m^3$), a relative dielectric constant of 3 and a distance of 4 Angstrom between the layers has a capacity of 18.7 mF at a weight of 5.66 mg. The specific capacity is $1.87 \cdot 10^6$ $F/m^3$ or $1.87 \cdot 10^6$ $nF/mm^3$.

At least one of the surfaces of the carbon nanomembrane or the surfaces of the pyrolysed carbon nanomembrane can be functionalized. The functionalizing may be performed by chemical lithography. The functionalizing allows binding of other molecules, such as aliphatic polymer chains (Amin et al., Small 2010, 6, 1623), to the at least one surface of the carbon nanomembrane. The binding of other molecules influences the relative dielectric constant of the carbon nanomembrane. The relative dielectric constant can thereby be adjusted according to one's needs.

The at least two two-layer structures may be wound onto a former or layered on top of each other. The winding or layering allows a very compact construction of the capacitor. The capacitor comprises in one aspect of the disclosure a multilayer structure comprising a first layer, a second layer and a third layer, wherein the first layer and the third layer each form at least one of at least two electrodes and comprise one or more pyrolysed carbon nanomembranes or one or more layers of graphene, and the second layer is a dielectric comprising one or more carbon nanomembranes. It is, however, possible in another aspect of the disclosure that one layer can be used as a first layer and as a third layer at the same time. Such capacitors are formed by winding onto a former or layering on top of each other a first layer and a second layer (i.e. at least two two-layer structures). It will be understood that it is necessary to wind or layer at least two two-layer structures instead of at least two multilayer structures in order to avoid that two electrodes are placed on top of one another.

Figure 2:
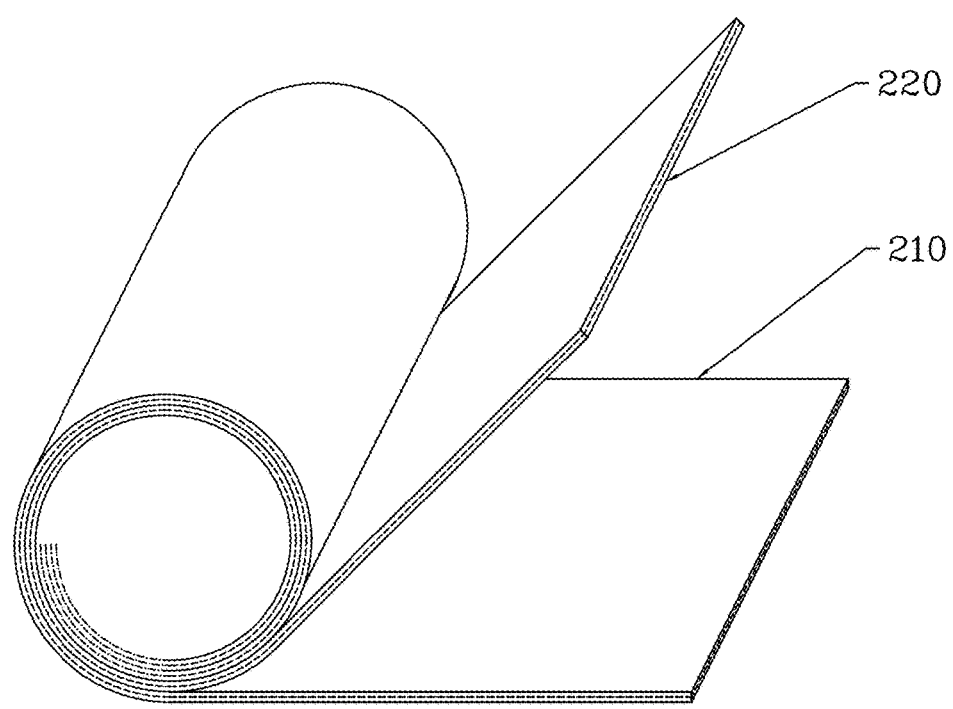
FIG. 2: Capacitor with two two-layer structures, wherein the two two-layer structures are wound onto each other

FIG. 2 shows a capacitor comprising two two-layer structures (a first two-layer structure 210 and a second two-layer structure 220), wherein each of the two two-layer structures comprises a first layer forming an electrode and a second layer forming a dielectric and wherein the two two-layer structures are wound onto a former.

Several alternative methods of manufacture of the multilayer structure of the present disclosure are possible. All of the disclosed methods of manufacture have in common that the multilayer structure is formed by applying the second layer onto a surface of the first layer, and applying the third layer onto a surface of the second layer. Therefore, all of the methods of manufacture have in common that the layers have to be transferred for forming the multilayer structure. The methods of manufacture only differ in the preparation methods of the first layer, the second layer and the third layer.

One or more layers of graphene can be provided as the first and/or the third layer. The first layer and/or the third layer may therefore comprise one or more pyrolysed carbon nanomembranes or one or more layers of graphene. The person skilled in the art will understand that in case of one or more layers of graphene as the first and/or the third layer, the same method of manufacture can be performed as in case of one or more pyrolysed carbon nanomembranes. Graphene can be manufactured by pyrolysing carbon nanomembranes, but—as discussed above—graphene can also be manufactured by other known methods. The second layer may be prepared as described above. The multilayer structure is thus formed by applying the second layer onto a surface of the first layer, and applying the third layer onto a surface of the second layer. It is thus possible that the first or the third layer comprise one or more layers of graphene while the respective other layer (i.e. the third or the first layer) comprise one or more pyrolysed carbon nanomembranes manufactured as described above.

The pyrolysis of the at least one carbon nanomembrane for forming the first and the third layer can be performed either before or after the at least one carbon nanomembrane is removed from the substrate. The cross-linking of the carbon-containing compounds ensures that the carbon nanomembranes are not burned during pyrolysis. The cross-linking of the carbon-containing compounds also ensures mechanical stability of the carbon nanomembrane.

A sacrificial layer may also be added on top of the carbon nanomembrane. The sacrificial layer and the carbon nanomembrane are then removed from the substrate together. The sacrificial layer protects the carbon nanomembrane from defects, which might occur during transfer of the carbon nanomembrane. The sacrificial layer also stabilizes the carbon nanomembrane.

The substrate only serves as an auxiliary means. The substrate can be discarded or re-used after the carbon nanomembrane is removed from the substrate.

The method of manufacture discussed above ensures that short circuits of the multilayer structure can be avoided despite the use of ultrathin layers, because the electrode layers are formed by two-dimensional materials, which are transferred as a whole and thus cover pinholes and small defects in the dielectric layer like a blanket.

The capacitors as described in the present disclosure can be used as a microelectronic device or as an energy storage device. The capacitors may be used for applications in the field of mobile communications, for example.

The carbon nanomembranes can be used as a dielectric because carbon nanomembranes can be used as insulators due to low current densities. To this end, the difference in electronic transport characteristics between pristine SAMs and carbon nanomembranes has been compared. The charge transport through aromatic SAMs or CNMs using a two terminal setup composed of a EGaIn tip as a top-probe electrode and an Au substrate as a second electrode has been studied. Three thiolphenyl homologues, i.e. biphenylthiol (BPT), terphenylthiol (TPT) and quaterphenylthiol (QPT), have been selected for the preparation of SAMs, and the electrical characteristics of pristine SAMs and CNMs have been compared.

SAM Preparation

For the preparation of 1,1'-biphenyl-4-thiol (BPT) SAMs, a 30 nm polycrystalline Au layer thermally evaporated on 9 nm Ti primed Si(100) substrate (Georg Albert Physical Vapor Deposition, Germany) was used. The substrate was cleaned with a UV/ozone cleaner (UVOH 150 LAB FHR) for 5 min, rinsed with ethanol, and then blown dry under a nitrogen stream. Afterwards the substrates were immersed into a ~10 mM solution of BPT in dry and degassed dimethylformamide (DMF) for 72 h in a sealed flask under nitrogen atmosphere at room temperature. For the preparation of 1",4',1',1-Terphenyl-4-thiol (TPT) SAMs and p-Quaterphenyl-4-thiol (QPT) SAMs, the same procedure was applied with the exception of SAM formation for 24 h in a sealed flask under nitrogen atmosphere at 70° C.

Electron Irradiation

Electron irradiation was achieved in high vacuum (p<5× $10^{-8}$ mbar) with an electron floodgun at an electron energy of 100 eV and a beam current of 3 mA. The electron dose density of 50 mC/cm$^2$ was applied for the cross-linking of SAMs.

Charge Transport Measurements of Molecular Junctions

The two-terminal setup consisted of a grounded Au substrate mounted on an X-Y positioning stage and a syringe with a flat needle connected to a Z axis micrometer positioning stage. The whole measurement was conducted in a home-built aluminium Faraday cage to prevent electrical noise. The whole Faraday cage was flushed with nitrogen to maintain a low level of humidity (RH=~12%). The tip was prepared by generating a small hanging droplet of Ga—In eutectic (75.5 wt % Ga and 24.5 wt % In) and bringing it into contact with a sacrificial gold substrate, and then retracting the syringe slowly back until the tip of the syringe separates from the tip on the substrate. The whole process was observed by a microscope camera (magnification=200). After the formation, the tip was oxidized for 15 minutes in air. Molecular junctions were formed by bringing the $Ga_2O_3$-EGaIn tip into contact with SAMs or CNMs formed on Au substrate. For statistical analysis, I-V curves were measured on each sample with 5 different tips, where each tip was used to form up to 5 junctions. The contact area was estimated by analyzing the image taken by the camera. The current through the junction was recorded as a function of V using a Keithley 236 measurement unit.

Two terminal I-V measurements were performed on the prepared molecular junctions. All the measurements were carried out in an inert and dry atmosphere to avoid the influence of an adsorbed water film at the SAM-$Ga_2O_3$ interface. A statistical model for data analysis was used (R. E. Holmlin et al., J Am Chem Soc 2001, 123, 5075; D. J. Wold et al., J Phys Chem B 2002, 106, 2813; T. Ishida et al., J Phys Chem B 2002, 106, 5886; S. Wakamatsu et al., Ultramicroscopy 2003, 97, 19.), i.e. fitting Gaussian functions to histograms of log|J|, where J is the current density.

Figure 3:
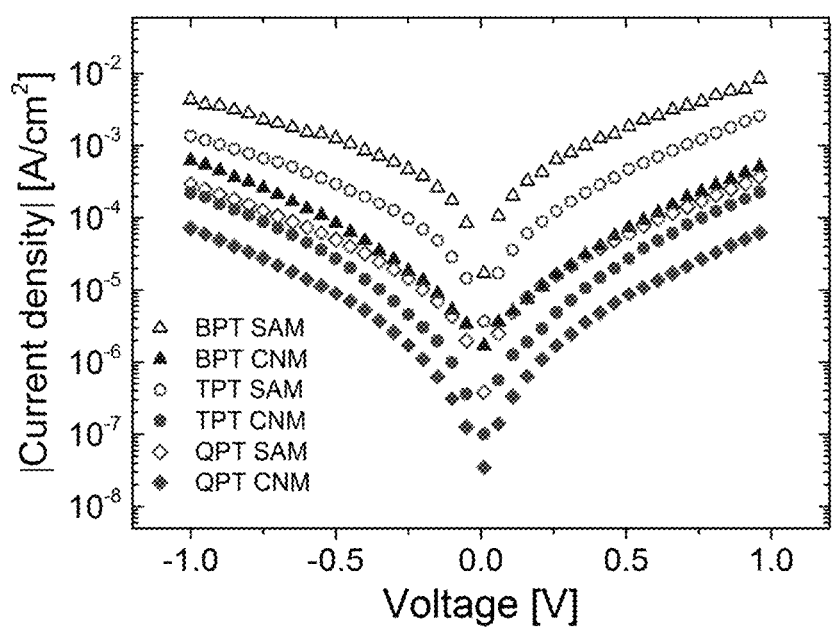
FIG. 3: Comparison of log|J| versus voltage for molecular junctions of SAMs and cross-linked SAMs (CNMs)

FIG. 3 shows the plots of Gaussian mean of the measured current density |J| (logarithmic scale) versus voltage for molecular junctions of SAMs and CNMs made from different aromatic molecules (biphenylthiol BPT, terphenylthiol TPT, quarterphenylthiol QPT). In general, the current densities of CNM-junctions were approximately an order of magnitude lower than SAM-junctions and decreased with increasing molecular length for both systems.

Example of a Capacitor

Figure 4:
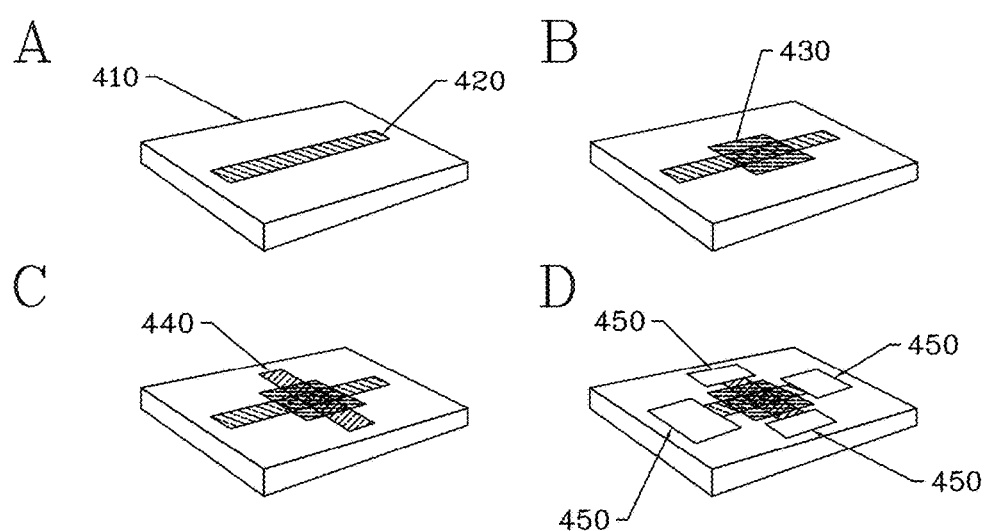
FIG. 4: Schematic of the manufacturing of a capacitor

FIG. 4 shows a schematic of the manufacturing of a capacitor. FIG. 4A shows a first layer (electrode) 420 on a substrate 410. In FIG. 4B, a second layer (dielectric) 430 is placed on the first layer (electrode) 420. A third layer (electrode) 440 on top of the second layer (dielectric) 430 is shown in FIG. 4C. Contact pads 450 for the electrodes are shown in FIG. 4D.

Figure 5:
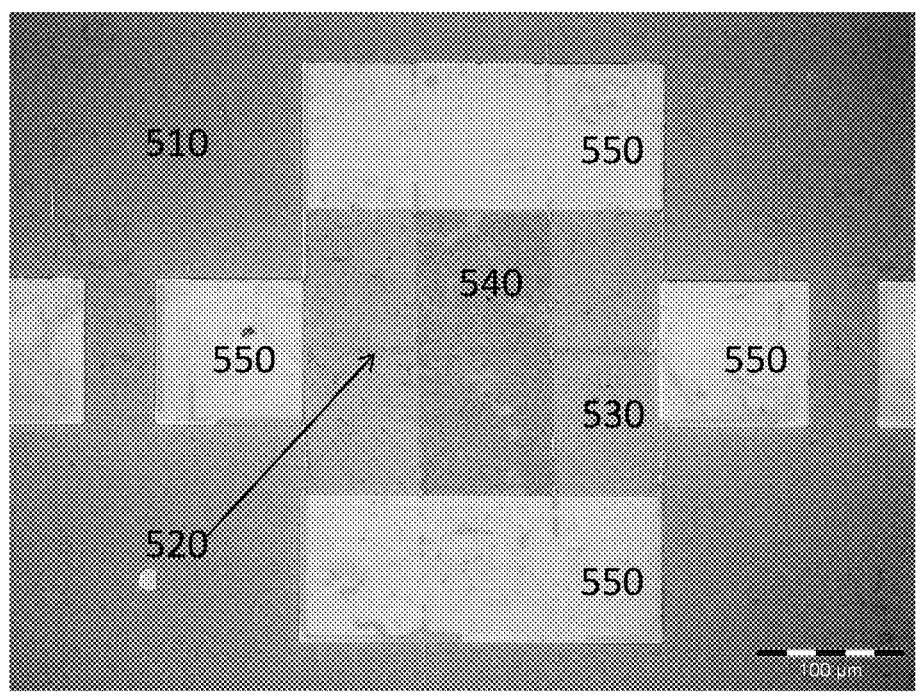
FIG. 5: Light microscopic image of a capacitor

FIG. 5 shows a light microscopic image of a capacitor manufactured according to FIG. 4 on a Si dioxide substrate 510 with a monolayer graphene 520 as a first layer (electrode), a monolayer CNM 530 as a second layer (dielectric), a monolayer graphene 540 as a third layer (electrode) and Au contact pads 550 for the electrodes. CVD graphene and biphenyl-CNMs were used. Structuring of the layers was performed by a combination of photolithography and oxygen plasma. A double layer of vapour-deposited tantalum and gold serves as an ideal electrical contact to the graphene electrodes. In the light microscopic image the different layers can be clearly distinguished from one another due to their different shadings.

REFERENCE NUMERALS

110 First layer
120 Second layer
130 Third layer
210 First two-layer structure
220 Second two-layer structure
410 Substrate
420 First layer (electrode)
430 Second layer (dielectric)
440 Third layer (electrode)
450 Contact pads
510 Si dioxide substrate
520 Monolayer graphene (first layer)
530 Monolayer CNM
540 Monolayer graphene (third layer)
550 Au contact pads

The invention claimed is:

1. A capacitor comprising a multilayer structure, the multilayer structure comprising a first layer, a second layer and a third layer, wherein the first layer and the third layer each form at least one of at least two electrodes and the first layer and the third layer comprise one or more pyrolysed carbon nanomembranes or one or more layers of graphene, and the second layer is a dielectric comprising one or more carbon nanomembranes that form a material with conjugated electron systems.

2. The capacitor according to claim 1, wherein at least one of the first layer or the third layer has a thickness of 0.3 to 20 nm.

3. The capacitor according to claim 1, wherein at least one of the one or more carbon nanomembranes of the second layer has a thickness of 1 to 2 nm and the total thickness of the second layer is 1 to 50 nm.

4. The capacitor according to claim 1, wherein the total thickness of the multilayer structure is 1.6 to 90 nm.

5. The capacitor according to claim 1, wherein the carbon nanomembranes of the first layer, the second layer, and/or the third layer comprise aromatic molecules, which are cross-linked in the lateral direction.

6. The capacitor according to claim 1, wherein the multilayer structure has a maximum capacitance of 5 $\mu F\ cm^{-2}$.

7. The capacitor according to claim 1, wherein at least one of the surfaces of the carbon nanomembrane or the surfaces of the pyrolysed carbon nanomembrane are functionalized.

8. The capacitor according to claim 1, comprising at least two two-layer structures, wherein one of the at least two two-layer structures comprises the first layer and the second layer, and the other of the at least two two-layer structures comprises the third layer and a further one of the second layer, and wherein the at least two two-layer structures are wound onto a former or layered on top of each other.

9. A microelectronic device comprising the capacitor according to claim 1.

10. An energy storage device comprising the capacitor according to claim 1.

* * * * *